(12) United States Patent
Sabu et al.

(10) Patent No.: US 9,396,937 B2
(45) Date of Patent: Jul. 19, 2016

(54) P-TYPE OXIDE COMPOSITION, AND METHOD FOR PRODUCING P-TYPE OXIDE COMPOSITION

(71) Applicants: Satomi Sabu, Shizuoka (JP); Kenkichiro Kobayashi, Shizuoka (JP)

(72) Inventors: Satomi Sabu, Shizuoka (JP); Kenkichiro Kobayashi, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 153 days.

(21) Appl. No.: 14/192,054

(22) Filed: Feb. 27, 2014

(65) Prior Publication Data
US 2014/0252344 A1    Sep. 11, 2014

(30) Foreign Application Priority Data

Mar. 7, 2013    (JP) .................... 2013-045036

(51) Int. Cl.
*H01L 21/02* (2006.01)
*H01L 29/221* (2006.01)
*H01L 29/861* (2006.01)

(52) U.S. Cl.
CPC ...... *H01L 21/02554* (2013.01); *H01L 21/0237* (2013.01); *H01L 21/0242* (2013.01); *H01L 21/02472* (2013.01); *H01L 21/02483* (2013.01); *H01L 21/02557* (2013.01); *H01L 21/02579* (2013.01); *H01L 21/02631* (2013.01); *H01L 29/221* (2013.01); *H01L 29/861* (2013.01)

(58) Field of Classification Search
None
See application file for complete search history.

(56) References Cited

U.S. PATENT DOCUMENTS 5,594,263 A * 1/1997 Bedard ............... H05L 51/4233
257/201
2009/0272972 A1    11/2009 Ogawa et al.

FOREIGN PATENT DOCUMENTS

JP    2005-277339    10/2005
WO    WO 2008/087856    7/2008

OTHER PUBLICATIONS

Tynell et al., "Atomic layer deposition of ZnO: a review," 2014, Semiconductor Science and Technology, 29, total pp. 15.*
K. Tamura, T. Makino, A. Tsukazaki, M. Sumiya, S. Puke, T. Furumochi, M. Lippmaa, C.H. Chia, Y. Segawa, H. Koinuma, M. Kawasaki, Solid State Communications 127 ,265 (2003).
C. H. Park, S. B. Zhang, and Su-Huai Wei Phys. Rev. 8 66, 073202 (2002).
S. Chu, J. H. Lim, L. J. Mandalapu, Z. Yang, L. Li, and J. L. Liu, Appl. Phys. Lett. 92, 152103 (2008).
Sukit Limpijumrsong, S. B. Zhang, Su-Huai Wei, and C. H. Pari, Phys. Rev. Lett. 92, 155504 (2004).
C. Persson, Phys. Rev, Letts., 97, 146403(2006).

* cited by examiner

*Primary Examiner* — Duy T Nguyen
*Assistant Examiner* — Bo Bin Jang
(74) *Attorney, Agent, or Firm* — Cooper & Dunham LLP (57) ABSTRACT

To provide an oxide composition, represented by: $ZnO_{1-x}S_{x+\alpha}$ ($0<x\leq0.5$, $\alpha>0$), where part of O sites of ZnO is substituted with an S atom, and another S atom is provided to an interstitial site by doping, and wherein the oxide composition is p-type.

4 Claims, 4 Drawing Sheets

P-TYPE OXIDE COMPOSITION, AND METHOD FOR PRODUCING P-TYPE OXIDE COMPOSITION

CROSS-REFERENCE TO RELATED APPLICATION

This disclosure is based on, and claims priority pursuant to 35 U.S.C. §119(a) from, Japanese patent application number 2013-045036, filed on Mar. 7, 2013.

BACKGROUND OF THE INVENTION

1. Field of the Invention

The present invention relates to a p-type zinc oxide (ZnO) based oxide composition, and a production method thereof.

2. Description of the Related Art

Illumination using a light emitting diode (LED) has recently been attracted attentions, because of awareness of environmental issues, and measures for achieving low energy consumption. In order to spread use of the LED even wider, it is necessary to reduce a cost, and provide stable supply. An inorganic LED typically uses GaN as a main material, but Ga is a rare metal, and is extremely expensive, i.e., 140 JPY or higher per 1 g (at the time of 2008). The acquisition of rare metals is getting more difficult because of the export restriction set by China, which is a producing country of rare metals. Therefore, a development of the LED using an inexpensive material, which can replace Ga, is an immediate need.

Meanwhile, ZnO is inexpensive. Similarly to GaN, the ZnO is a direct transition semiconductor. Therefore, the ZnO has been attracted attentions as a light emitting material for a long time. However, a development of the LED using the ZnO has not been made progress. One of the reasons is that it is difficult to produce a p-type ZnO. This is because a donor, which is an oxygen defect, tends to be preferentially generated in the ZnO, and therefore it is difficult to introduce an acceptor using a typical method.

Various single atom acceptors, such as nitrogen (N), lithium (Li), phosphorus (P), arsenic (As), and antimony (Sb), have been studied so far, but a definite acceptor has not yet been found. For example, nitrogen cannot increase a hole density as an acceptor level thereof is deep, i.e., 0.2 eV. Therefore, there is a problem that an electrical resistivity cannot be reduced (K. Tamura, T. Makino, A. Tsukazaki, M. Sumiya, S. Fuke, T. Furumochi, M. Lippmaa, C. H. Chia, Y. Segawa, H. Koinuma, M. Kawasaki, Solid State Communications 127, 265 (2003)). Moreover, Li can act as an acceptor with substituting the Zn site. However, an interstitial Li atom tends to be generated at the same time. Therefore, there is a problem that Li cannot function as an effective acceptor (C. H. Park, S. B. Zhang, and Su-Huai Wei, Phys. Rev. B 66, 073202 (2002)). Moreover, there is a report that a p-type ZnO has been realized by adding the group V elements other than nitrogen, e.g., P, As, and Sb, and a LED has been able to be produced experimentally (S. Chu, J. H. Lim, L. J. Mandalapu, Z. Yang, L. Li, and J. L. Liu, Appl. Phys. Lett. 92, 152103 (2008)). It can be understood that P, As, and Sb act as a donor with substituting Zn sites, and a complex with a Zn defect (VZn) is acting as an acceptor. However, it has been theoretically pointed out that generation of such a complex is hard to occur (Sukit Limpijumnong, S. B. Zhang, Su-Huai Wei, and C. H. Park, Phys. Rev, Lett. 92, 155504 (2004)), and an origin of the acceptor is unknown. Moreover, further experiments conducted by other research groups have not been succeeded, and therefore there is a problem in reproducibility.

It has been found out from various researched conducted so far that it is difficult to provide a single acceptor to a ZnO lattice through doping, and the acceptor level thereof is deep. In order to overcome these problems, simultaneous doping where a donor and an acceptor are added at the same time, cluster doping where a donor-acceptor complex is provided by doping, and delta doping where an acceptor is added periodically have also been studied. As a result of these new methods, a concentration of an acceptor can be made high, and the depth of the level can be made slightly shallow. However, the effects thereof are not significant.

As for a method for realizing a shallow acceptor level, other than a method for changing a type of a dopant, there is a method where the energy of the upper end of the valence band of ZnO, which is a host, is increased. $ZnO_{1-x}S_x$, which is a mixed crystal of ZnO and ZnS, reduces its band gap in the range of 0<x<0.5. However, it has been known that this reduction is caused as only the energy level of the valence band eased (C. Persson, Phys. Rev. Letts., 97, 146403 (2006)). From this, it is considered that formation of a shallow acceptor level can be realized by using $ZnO_{1-x}S_x$ as a host, and providing an acceptor to $ZnO_{1-x}S_x$ through doping. In fact, it has been theoretically pointed out in C. Persson, Phys. Rev. Letts., 97, 146403 (2006) that an acceptor level of nitrogen is made significantly shallow. However, it has not yet reported that a p-type $ZnO_{1-x}S_x$ film is realized by nitrogen doping.

SUMMARY OF THE INVENTION

Considering the situation mentioned above, the present invention aims to realize a p-type ZnO-based oxide composition, which is highly stable and has a high hole concentration.

To solve the aforementioned problem, the present inventors have diligently conducted studies. As a result, it has found that the aforementioned problem can be solved by the following composition.

Namely, the oxide composition of the present invention is as follows:

An oxide composition, represented by:

$$ZnO_{1-x}S_{x+\alpha} \ (0 < x \leq 0.5, \alpha > 0)$$

where part of O sites of ZnO is substituted with an S atom, and another S atom is provided to an interstitial site by doping, and wherein the oxide composition is p-type.

The present invention can provide a novel p-type ZnO-based oxide composition, which is highly stable and has a high hole concentration.

DETAILED DESCRIPTION OF THE INVENTION

The oxide composition of the present invention is represented by $ZnO_{1-x}S_{x+\alpha}$ (0<x≤0.5, α>0) where part of O sites of ZnO is substituted with an S atom, and another S atom is provided to an interstitial site by doping, and is p-type.

A p-type oxide composition is realized by substituting part of the O sites of ZnO with an S atom, and providing another S atom to interstitial site by doping.

The value of x in the $ZnO_{1-x}S_{x+\alpha}$ ($0<x\leq0.5$, $\alpha>0$) is more preferably $0<x\leq0.3$. As x is in the range represented by $0<x\leq0.3$, an acceptor level is formed at the higher energy position than the top end of the valence band.

Moreover, the value of $\alpha$ in the $ZnO_{1-x}S_{x+\alpha}$ ($0<x\leq0.5$, $\alpha>0$) is more preferably $0<\alpha\leq0.03$. As a is in the range represented by $0<\alpha\leq0.03$, a p-type oxide composition, in which a doped S atom is stably present at the interstitial site, can be obtained.

Moreover, the oxide composition of the present invention preferably has a band gap of 2.5 eV to 3.3 eV, more preferably 2.83 eV to 3.0 eV. As the band gap is 2.5 eV to 3.3 eV, an acceptor level is formed at the higher energy position than the top end of the valence band. Moreover, a stable p-type oxide composition can be obtained when the band gap is 2.83 eV to 3.0 eV.

The electrical resistivity of the oxide composition of the present invention is preferably greater than 0 Ωcm but $5\times10^5$ Ωcm or less, more preferably greater than 0 Ωcm but 50 Ωcm or less. As the elect resistivity is greater than 0 Ωcm but $5\times10^5$ Ωcm or less, a resulting p-type oxide composition can be used as a p-type layer of a pn junction device. As the electrical resistivity is greater than 0 Ωcm but 50 Ωcm or less, moreover, a resulting p-type oxide composition can be used as a p-type layer of a low resistance pn junction device.

The oxide composition of the present invention can be produced, for example, by pulsed laser deposition (PLD).

Specifically, for example, a target is provided in a vacuum chamber, for example, at the pressure of $2.0\times10^{-2}$ Torr (composed of oxygen of $0.4\times10^{-2}$ Torr, and nitrogen of $1.6\times10^{-2}$ Torr). A substrate is fixed so that the substrate is parallel to the target. While supplying sulfur gas, which has been heated to certain temperature, onto the substrate, KrF excimer laser is applied to the target. As a result, an oxide composition is obtained on the substrate. In this case, the oxide composition is formed in the form of a film. In the case where the oxide composition is used for a semiconductor device etc., a thickness of the film is preferably 20 nm to 1,000 nm.

As for the target, usable are a mixed crystal of zinc oxide and zinc sulfide, which has the composition formula of $ZnO_{1-x2}S_{x2}$ ($0<x2<1$), a mixture of zinc oxide and zinc sulfide, which has the composition formula of $ZnO_{1-x2}S_{x2}$ ($0<x2<1$), and a mixture containing a mixed crystal of zinc oxide and zinc sulfide, zinc oxide, and zinc sulfide, which has the composition formula of $ZnO_{1-x2}S_{x2}$ ($0<x2<1$). The mixed crystal of zinc oxide and zinc sulfide, which has the composition formula of $ZnO_{1-x2}S_{x2}$ ($0<x2<1$), the mixture of zinc oxide and zinc sulfide, which has the composition formula of $ZnO_{1-x2}S_{x2}$ ($0<x2<1$), and the mixture containing a mixed crystal of zinc oxide and zinc sulfide, zinc oxide, and zinc sulfide, which has the composition formula of $ZnO_{1-x2}S_{x2}$ ($0<x2<1$) are collectively referred to as "a composition having the composition formula of $ZnO_{1-x2}S_{x2}$ ($0<x2<1$)" hereinafter.

Figure 1:
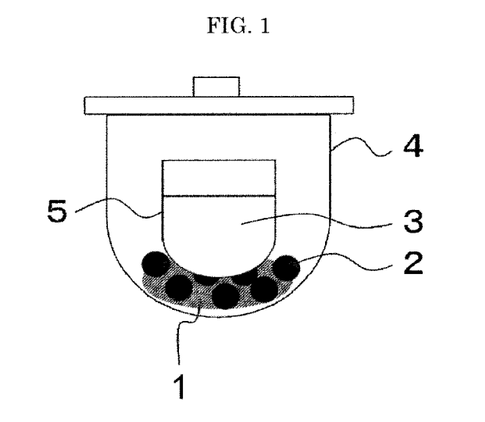
FIG. 1 is an explanatory diagram illustrating a treating method of a ZnO target.

The target composed of the composition having the composition formula of $ZnO_{1-x2}S_{x2}$ ($0<x2<1$) is obtained by subjecting a ZnO target to a heat treatment in a sulfur atmosphere, or baking a ZnO powder in a sulfur atmosphere. As for an example of the former method, the target can be produced by providing a ZnO target, which is produced by baking a powder ZnO powder, in an inner melting pot 5, and subjecting the inner melting pot 5 to a heat treatment in an outer melting pot 4, into which activated carbon 2 and flower of sulfur 1 are added, as illustrated in FIG. 1. An amount of S in a target to be obtained can be adjusted by controlling temperature and duration of the treatment performed on the ZnO powder, or ZnO target 3.

As for the substrate, for example, a quartz substrate, a silicon substrate, a sapphire substrate, a zinc oxide substrate, an yttria-stabilized zirconia (YSZ) substrate, or a SiC substrate can be used. A quartz substrate is preferably used.

The substrate temperature during production of the oxide composition can be controlled in the range of 20° C. to 500° C. by a heater provided at the back side of the substrate. Moreover, the substrate temperature is preferably 200° C. to 300° C.

The heating temperature of sulfur gas supplied onto the substrate during production of the oxide composition is preferably 50° C. to 80° C.

Moreover, the oxide composition of the present invention can be also produced by plasma assisted chemical vapor deposition (CVD), or metal organic chemical vapor deposition (MOCVD). In this case, the oxide composition is also formed in the form of a film.

To realize a highly stable p-type ZnO-based oxide composition, it is essential to stabilize an acceptor. In the present invention, an interstitial S atom is provided as an acceptor through doping. Doping of the interstitial S atom, which is typically difficult to be generated, is possible, as $ZnO_{1-x}S_x$, which is a metastable phase relative to a mixture of ZnO and ZnS, is used as a host. In the case where an oxygen defect $V_O$ is present, a single interstitial S atom is more stabilized by formation of a complex $S_i$-Vo-$S_i$ of interstitial $S(S_i)$ and $V_O$.

In order to realize a p-type ZnO of a high hole concentration, it is necessary to form a shallow acceptor level. In the present invention, a shallow acceptor level can be realized by using, as a host, $ZnO_{1-x}S_x$, has higher energy of the upper end of the valence band than that of ZnO due to the formation of a mixed crystal. Moreover, the interstitial S atom, which is an acceptor in the present, forms a $S_i$-$V_O$-$S_i$ complex when the oxygen defect $V_O$ is present as described above. It is assumed that an acceptor level of this complex is shallower than an acceptor level of the interstitial S atom.

Whether or not part of O sites of ZnO is substituted with an S atom in the oxide composition of the present invention can be confirmed with a lattice constant and band gap of the oxide composition.

As part of O sites of ZnO is substituted with an S atom, the lattice constant thereof becomes larger than that of ZnO because an ion diameter of the S atom is larger than that of the O atom. The lattice constant can be measured by X-ray diffraction (XRD). A diffraction peak of the plane (0002) of ZnO is 34.4°. Once part of O sites of ZnO is substituted with an S atom to form a mixed crystal, the position of the diffraction peak of the plane (0002) is shifted. As a result, the lattice constant becomes large.

When part of O sites of ZnO is substituted with an S atom, moreover, the 3p orbital of the S atom contributes to a valence band, in addition to the 2p orbital of the O atom. Therefore, the energy the upper end of the valence band is increased. As a result, the band gap thereof becomes smaller than that of ZnO. The band gap can be confirmed by measuring absorption edge of an absorption spectrum of the oxide composition. In case of ZnO, the absorption edge corresponding to the band gap 3.3 eV is 376 nm. Once part of O sites of ZnO is substituted with an S atom to form a mixed crystal, the absorption edge is shifted to the long-wavelength side, to thereby reduce a band gap.

Figure 2A:
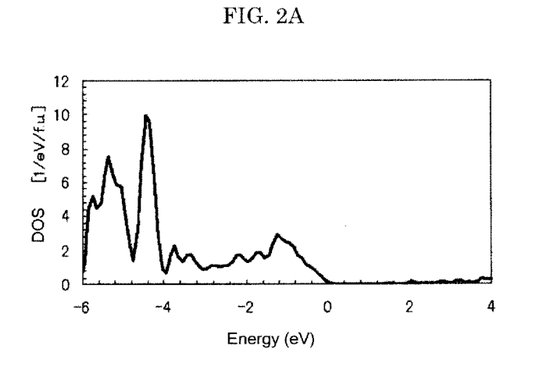
FIG. 2A illustrate the DOS of ZnO determined by first-principle calculation.
Figure 2B:
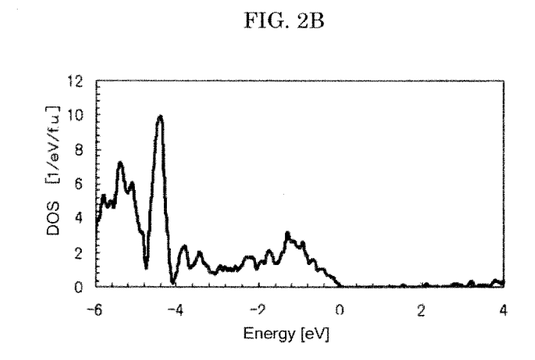
FIG. 2B illustrates the DOS of ZnO, in which one of O sites is substituted with an S atom.
Figure 2C:
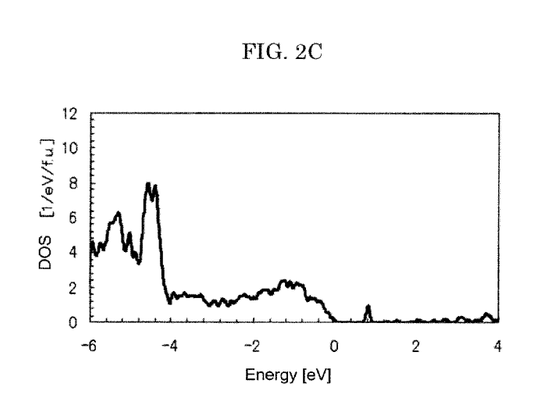
FIG. 2C illustrates the DOS of ZnO, in which one S atom is provided to an interstitial site by doping.

Whether or not another S atom is provided to an interstitial site through doping can be confirmed by confirming a presence of a hole, that is, proving a p-type semiconductor. This is because a result of a first-principle calculation has been obtained that an acceptor level is formed once an S atom is provided to an interstitial site through doping, and it becomes a p-type semiconductor. The density of states (DOS) of ZnO obtained by the first-principle calculation is depicted in FIG. 2A. The DOS of ZnO, in which one of the O sites is substituted with an S atom, is depicted in FIG. 2B. The DOS of ZnO, in which one S atom is provided to an interstitial site through doping, is depicted in FIG. 2C. It can be seen from these figures that an acceptor level is formed as long as the S atom is provided to an interstitial site through doping. In the case where an S atom is provided to an interstitial site through doping, there are possibilities of a several interstitial S atom sites. According to the first-principle calculation, a result that an acceptor level is formed at least at the most stable interstitial site.

By combining the p-type ZnO of the present invention and a conventional n-type ZnO, both the n-type ZnO and p-type ZnO are provided. Therefore, use thereof as a semiconductor device, such as a light emitting device, photoelectric conversion device, and light receiving device formed of ZnO, can be extended. For example, the oxide composition of the present invention can be suitably used for an LED.

EXAMPLES

Production Examples for producing a p-type ZnO film by pulsed laser deposition (PLD) are described hereinafter.

Note that, Production Examples 1-5, 1-6, 1-9, 1-10, 2-5, 2-8, 2-9, 3-4, and 3-5 are examples of the present invention.

Production Example 1-1

A target was provided in a vacuum chamber having the pressure of $2.0 \times 10^{-2}$ Torr (composed of oxygen of $0.4 \times 10^{-2}$ Torr and nitrogen of $1.6 \times 10^{-2}$ Torr). A quartz substrate was fixed so that the substrate was parallel to the target. While supplying sulfur gas of 25° C. onto the quartz substrate, KrF excimer laser was applied to the target, to thereby produce a film on the quartz substrate.

The target was produced in the following manner. To an outer melting pot (upper diameter: 73 mm, the lower diameter: 50 mm, height: 62 mm), 5 g of activated carbon, and 3 g of flower of sulfur were added. An inner melting pot (upper diameter: 52 mm, lower diameter: 30 mm, height: 36 mm), in which a ZnO target (a target produced by baking a ZnO powder at 900° C.) was provided in the outer inciting pot. The outer melting pot, in which the inner melting pot had been placed, was processed in an electric furnace at 200° C. for 6 hours, to thereby produce the aforementioned target.

During the production of the film, the temperature of the quartz substrate was controlled to 200° C. by a heater provided at the back side of the quartz substrate. The distance between the quartz substrate and the target was adjusted to 3 cm. The deposition duration was 30 minutes. Moreover, the pulse energy of the excimer laser was 100 mJ, and the repeated frequency was 10 pps.

Production Example 1-2

A ZnO-based oxide composition film of Production Example 1-2 was produced in the same manner as in Production Example 1-1, provided that the temperature of sulfur gas was changed to 40° C.

Production Example 1-3

A ZnO-based oxide composition film of Production Example 1-3 was produced in the same manner as in Production Example 1-1, provided that the temperature of sulfur gas was changed to 50° C.

Production Example 1-4

A ZnO-based oxide composition film of Production Example 1-4 was produced in the same manner as in Production Example 1-1, provided that the temperature of sulfur gas was changed to 60° C.

Production Example 1-5

A ZnO-based oxide composition film of Production Example 1-5 was produced in the same manner as in Production Example 1-1, provided that the temperature of sulfur gas was changed to 70° C.

Production Example 1-6

A ZnO-based oxide composition film of Production Example 1-6 was produced in the same manner as in Production Example 1-1, provided that the temperature of sulfur gas was changed to 80° C.

Production Example 1-7

A ZnO-based oxide composition film of Production Example 1-7 was produced in the same manner as in Production Example 1-1, provided that the temperature of the quartz substrate was changed to 300° C.

Production Example 1-8

A ZnO-based oxide composition film of Production Example 1-8 was produced in the same manner as in Production Example 1-7, provided that the temperature of sulfur gas was changed to 60° C.

Production Example 1-9

A ZnO-based oxide composition film of Production Example 1-9 was produced in the same manner as in Production Example 1-7, provided that the temperature of sulfur gas was changed to 70° C.

Production Example 1-10

A ZnO-based oxide composition film of Production Example 1-10 was produced in the same manner as in Production Example 1-7, provided that the temperature of sulfur gas was changed to 80° C.

Production Example 2-1

A ZnO-based oxide composition film of Production Example 2-1 was produced in the same manner as in Production Example 1-1, The processing temperature of the ZnO target was as changed from 200° C. to 250° C.

Production Example 2-2

A ZnO-based oxide composition film of Production Example 2-2 was produced in the same manner as in Production Example 2-1, provided that the temperature of sulfur gas was changed to 50° C.

Production Example 2-3

A ZnO-based oxide composition film of Production Example 2-3 was produced in the same manner as in Production Example 2-1, provided that the temperature of sulfur gas was changed to 60° C.

Production Example 2-4

A ZnO-based oxide composition film of Production Example 2-3 was produced in the same manner as in Production Example 2-1, provided that the temperature of sulfur gas was changed to 70° C.

Production Example 2-5

A ZnO-based oxide composition film of Production Example 2-5 was produced in the same manner as in Production Example 2-1, provided that the temperature of sulfur gas was changed to 80° C.

Production Example 2-6

A ZnO-based oxide composition film of Production Example 2-6 was produced in the same manner as in Production Example 2-1, provided that the temperature of the quartz substrate was changed to 300° C.

Production Example 2-7

A ZnO-based oxide composition film of Production Example 2-7 was produced in the same manner as in Production Example 2.6, provided that the temperature of sulfur gas was changed to 60° C.

Production Example 2-8

A ZnO-based oxide composition film of Production Example 2-8 was produced in the same manner as in Production Example 2-6, provided that the temperature of sulfur gas was changed to 70° C.

Production Example 2-9

A ZnO-based oxide composition film of Production Example 2-9 was produced in the same manner as in Production Example 2-6, provided that the temperature of sulfur gas was changed to 80° C.

Production Example 2-10

A ZnO-based oxide composition film of Production Example 2-10 was produced in the same manner as in Production Example 2-1, provided that the temperature of the quartz substrate was changed to 400° C.

Production Example 2-11

A ZnO-based oxide composition film of Production Example 2-11 was produced in the same manner as in Production Example 2-10, provided that the temperature of sulfur gas was changed to 80° C.

Production Example 3-1

A target was provided in a vacuum chamber at the pressure of $2.0 \times 10^{-2}$ Torr (composed of oxygen of $0.4 \times 10^{-2}$ Torr and nitrogen of $1.6 \times 10^{-2}$ Torr). A quartz substrate was fixed so that the substrate was parallel to the target. KrF excimer laser was applied to the target, to thereby produce a film on the quartz substrate. As for the target, a composition having a formula $Zn_{0.93}S_{0.07}$, which was obtained by baking a ZnO powder in the S, O atmosphere at 850° C., was used. During the production of the film, the temperature of the quartz substrate was controlled to 200° C. by a heater provided at the back side of the quartz substrate. The distance between the quartz substrate and the target was adjusted to 3 cm. The deposition duration was 30 minutes. Moreover, the pulse energy of the excimer laser was 80 mJ, and the repeated frequency was 10 pps.

Production Example 3-2

A target was provided in a vacuum chamber at the pressure of $2.0 \times 10^{-2}$ Torr (composed of oxygen of $0.4 \times 10^{-2}$ Torr and nitrogen of $1.6 \times 10^{-2}$ Torr). A quartz substrate was fixed so that the substrate was parallel to the target. While supplying sulfur gas, which had been heated to 40° C. onto the quartz substrate. KrF excimer laser was applied to the target, to thereby produce a film on the quartz substrate. As for the target, a composition having a formula $Zn_{0.93}S_{0.07}$, which was obtained by baking a ZnO powder in the S, O atmosphere at 850° C., was used. During the production of the film, the temperature of the quartz substrate was controlled to 200° C. by a heater provided at the back side of the quartz substrate. The distance between the quartz substrate and the target was adjusted to 3 cm. The deposition duration was 30 minutes. Moreover, the pulse energy of the excimer laser was 80 mJ, and the repeated frequency was 10 pps.

Production Example 3-3

A ZnO-based oxide composition film of Production Example 3-3 was produced in the same manner as in Production Example 3-2, provided that the temperature of sulfur gas was changed to 50° C.

Production Example 3-4

A ZnO-based oxide composition film of Production Example 3-4 was produced in the same manner as in Production Example 3-2, provided that the temperature of sulfur gas was changed to 60° C.

Production Example 3-5

A ZnO-based oxide composition film of Production Example 3-5 was produced in the same manner as in Production Example 3-2, provided that the temperature of sulfur gas was changed to 70° C.

Production Example 3-6

A ZnO-based oxide composition film of Production Example 3-6 was produced in the same manner as in Production Example 1-1, provided that the ZnOS-based target was changed to ZnO, and sulfur gas was not supplied during production of a film.

[Measuring Method]

An X-ray diffraction pattern of each of the films obtained in Production Examples 1-1 to 1-10, 2-1 to 2-11, and 3-1 to 3-6. The c-axis lattice constant was determined from the obtained X-ray diffraction pattern, and a composition was calculated based on Vegard's law. Note that, the obtained composition did not contain S, which was provided between lattice by doping.

Moreover, an absorption spectrum of each of the films obtained in Production Examples 1-1 to 1-10, 2-1 to 2-11, and 3-1 to 3-6 was measured, and a band gap was calculated from the edges of the absorption spectrum.

Furthermore, the Seebeck effect of each of the films obtained in Production Examples 1-1 to 1-10, 2-1 to 2-11, and 3-1 to 3-6 was measured. The Seebeck measuring device employed a two terminal measurement, and gold electrodes were used as both electrodes of the low temperature side and the high temperature side. The high temperature electrode was heated to 80° C. by a ceramic heater, and the low temperature electrode was set to room temperature. The thermoelectromotive force was measured by a multimeter having the input impedance of 1 GΩ. A type of the carrier was determined with negative or positive of the Seebeck coefficient α. In the case of α<0, it was determined as n-type. In the case of α>0, it was determined as p-type. In the case where a clear electromotive force was not generated upon giving a temperature difference between the two terminals, it was determined that n-type and p-type were coexisting In the system of $ZnO_{1-x}S_x$, there is no effect of ion conductivity, as a constant conductivity (electrical resistivity) is obtained in a measurement of direct current conductivity. In this case, the positive Seebeck coefficient indicates the presence of holes. In fact, it is suggested from the current-voltage characteristics of the pn junction that the p-type is owing to the generation of holes in the sample whose p-type is determined by the Seebeck effect. If it is ion conductive, the current-voltage characteristics do not exhibit rectification.

Moreover, the electrical resistivity of each of the films obtained in Production Examples 1-1 to 1-10, 2-1 to 2-11, and 3-1 to 3-6 was measured using a four-point probe van der Pauw method, Advantest, DC voltage current source R6143, and Advantest, digital electrometer R8240 were used.

The results of the measurements are depicted in Tables 1 to 3.

TABLE 1

|  | Substrate temperature [° C.] | Sulfur heating temperature [° C.] | c-axis lattice constant [nm] | Composition formula | Band gap [eV] | Seebeck measurement | Electrical resistivity [Ω cm] |
| --- | --- | --- | --- | --- | --- | --- | --- |
| Production Ex. 1-1 | 200 | 25 | 0.532 | $ZnO_{0.88}S_{0.12}$ | 2.97 | n | $4.05 \times 10^1$ |
| Production Ex. 1-2 | 200 | 40 | 0.531 | $ZnO_{0.89}S_{0.11}$ | 2.98 | n | $2.70 \times 10^1$ |
| Production Ex. 1-3 | 200 | 50 | 0.531 | $ZnO_{0.89}S_{0.11}$ | 2.98 | p and n are coexisting | $8.10 \times 10^3$ |
| Production Ex. 1-4 | 200 | 60 | 0.533 | $ZnO_{0.87}S_{0.13}$ | 2.96 | p and n are coexisting | $2.03 \times 10^4$ |
| * Production Ex. 1-5 | 200 | 70 | 0.538 | $ZnO_{0.83}S_{0.17}$ | 2.92 | p | $4.05 \times 10^4$ |
| * Production Ex. 1-6 | 200 | 80 | 0.531 | $ZnO_{0.89}S_{0.11}$ | 2.98 | p | $3.38 \times 10^4$ |
| Production Ex. 1-7 | 300 | 25 | 0.535 | $ZnO_{0.86}S_{0.14}$ | 2.95 | p and n are coexisting | $1.35 \times 10^4$ |
| Production Ex.1-8 | 300 | 60 | 0.532 | $ZnO_{0.88}S_{0.12}$ | 2.97 | p and n are coexisting | $1.35 \times 10^3$ |
| * Production Ex. 1-9 | 300 | 70 | 0541 | $ZnO_{0.80}S_{0.20}$ | 2.89 | p | $4.73 \times 10^3$ |
| * Production Ex. 1-10 | 300 | 80 | 0.539 | $ZnO_{0.82}S_{0.18}$ | 2.91 | p | $8.10 \times 10^4$ |

In Table 1, "*" denotes Example.

TABLE 2

|  | Substrate temperature [° C.] | Sulfur heating temperature [° C.] | c-axis lattice constant [nm] | Composition formula | Band gap [eV] | Seebeck measurement | Electrical resistivity [Ω cm] |
| --- | --- | --- | --- | --- | --- | --- | --- |
| Production Ex. 2-1 | 200 | 25 | 0.525 | $ZnO_{0.95}S_{0.05}$ | 3.07 | p and n are coexisting | $2.03 \times 10^3$ |
| Production Ex. 2-2 | 200 | 50 | 0.534 | $ZnO_{0.87}S_{0.13}$ | 2.96 | p and n are coexisting | $1.08 \times 10^2$ |
| Production Ex. 2-3 | 200 | 60 | 0.535 | $ZnO_{0.86}S_{0.14}$ | 2.95 | p and n are coexisting | $1.22 \times 10^3$ |
| Production Ex. 2-4 | 200 | 70 | 0.534 | $ZnO_{0.86}S_{0.14}$ | 2.95 | p and n are coexisting | $1.08 \times 10^4$ |
| * Production Ex. 2-5 | 200 | 80 | 0.532 | $ZnO_{0.88}S_{0.12}$ | 2.97 | p | $4.73 \times 10^5$ |

TABLE 2-continued

| | Substrate temperature [° C.] | Sulfur heating temperature [° C.] | c-axis lattice constant [nm] | Composition formula | Band gap [eV] | Seebeck measurement | Electrical resistivity [Ω cm] |
|---|---|---|---|---|---|---|---|
| Production Ex. 2-6 | 300 | 25 | 0.528 | $ZnO_{0.92}S_{0.08}$ | 3.04 | p and n are coexisting | $2.03 \times 10^3$ |
| Production Ex. 2-7 | 300 | 60 | 0.532 | $ZnO_{0.89}S_{0.11}$ | 2.98 | p and n are coexisting | $6.08 \times 10^3$ |
| * Production Ex. 2-8 | 300 | 70 | 0.543 | $ZnO_{0.78}S_{0.22}$ | 2.87 | p | $1.35 \times 10^4$ |
| * Production Ex. 2-9 | 300 | 80 | 0547 | $ZnO_{0.74}S_{0.26}$ | 2.83 | p | $7.43 \times 10^4$ |
| Production Ex. 2-10 | 400 | 25 | 0.531 | $ZnO_{0.89}S_{0.11}$ | 2.98 | p and n are coexisting | $8.10 \times 10^3$ |
| Production Ex. 2-11 | 400 | 80 | 0.538 | $ZnO_{0.83}S_{0.17}$ | 2.92 | — | insulated |

In Table 2, "*" denotes Example.

TABLE 3

| | Substrate temperature [° C.] | Sulfur heating temperature [° C.] | c-axis lattice constant [nm] | Composition formula | Band gap [eV] | Seebeck measurement | Electrical resistivity [Ω cm] |
|---|---|---|---|---|---|---|---|
| Production Ex. 3-1 | 200 | No addition of sulfur | 0.528 | $ZnO_{0.93}S_{0.07}$ | 3.05 | n | $3.35 \times 10^{-2}$ |
| Production Ex. 3-2 | 200 | 40 | 0.530 | $ZnO_{0.91}S_{0.09}$ | 3.03 | n | $6.03 \times 10^{-2}$ |
| Production Ex. 3-3 | 200 | 50 | 0.531 | $ZnO_{0.90}S_{0.10}$ | 2.97 | n | $2.68 \times 10^{-1}$ |
| * Production Ex. 3-4 | 200 | 60 | 0.530 | $ZnO_{0.91}S_{0.09}$ | 2.99 | p | $4.68 \times 10$ |
| * Production Ex. 3-5 | 200 | 70 | 0.532 | $ZnO_{0.89}S_{0.11}$ | 2.98 | p | $1.07 \times 10^4$ |
| Production Ex. 3-6 | 200 | No addition of sulfur | 0.521 | ZnO | 3.30 | n | $2.50 \times 10^{-2}$ |

In Table 3, "*" denotes Example.

[Measurement of Current-Voltage Characteristics of pn Junction Diode]

Figure 3:
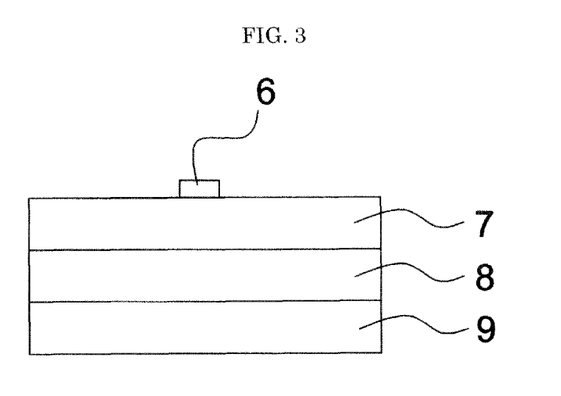
FIG. 3 is an explanatory diagram illustrating a structure of a pn junction diode produced in Example.

In order to confirm that a pn junction using the produced film of the ZnO-based oxide composition was possible, a pn junction diode was produced, and current-voltage (I-V) characteristics thereof were measured. The structure of the pn junction diode is illustrated in FIG. 3. An IZO film serving as an n-type layer 8 was provided on a glass substrate 9, a film of a p-type ZnO-based oxide composition serving as a p-type layer 7 was provided on the IZO film, and an electrode 6 formed of gold (Au) was provided on the p-type ZnO-based oxide composition film.

The n-type IZO film was produced by RF sputtering. The production conditions included the RF output of 30 W, and the pressure of $2 \times 10^{-3}$ Torr. The thickness thereof was 200 nm.

The p-type ZnO-based oxide composition film was produced by PLD under the conditions identical to the production method of the p-type ZnO-based oxide composition film in Production Example 3-4 (using a target, $ZnO_{0.93}S_{0.07}$, produced by baking in the O,S atmosphere at 850° C., the substrate temperature: 200° C., sulfur heating temperature: 60° C.). The thickness thereof was 300 nm.

The electrode 6 (gold electrode) was produced by depositing Au on the p-type layer 7 through PLD. As for the deposition conditions, the pressure was 0.04 Torr, and the deposition duration was 5 minutes. The pulse energy of the excimer laser was 50 mJ, and the repeated frequency was 10 pps. The area of the electrode was 10 μm×10 μm, i.e., $1.0 \times 10^{-6}$ mm$^2$.

Figure 4:
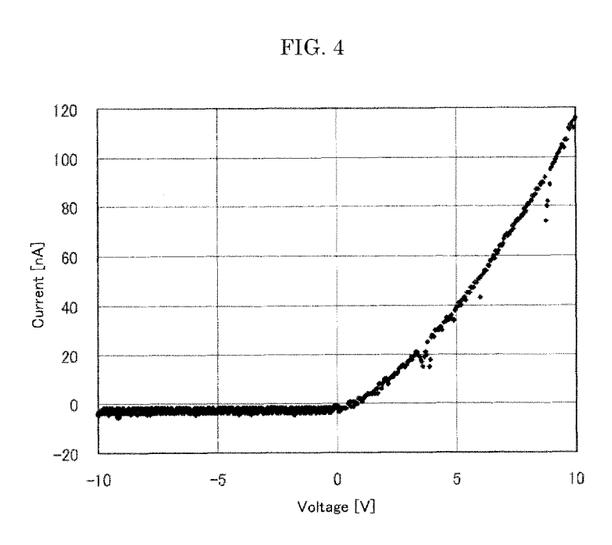
FIG. 4 is an explanatory diagram depicting current-voltage characteristics of the pn junction diode produced by using the ZnO film of Production Example 3-4.

The I-V characteristics of the produced pn junction diode are depicted in FIG. 4. The current was passed through with forward bias (voltage>0 V), but the current was not passed through with reverse bias (voltage<0 V), from which it was found that the pn junction diode had rectification. Accordingly, it was confirmed that pn junction using the film of the ZnO-based oxide composition produced in Production Example 3-4 was possible.

This application claims priority to Japanese application No. 2013-045036, filed on Mar. 7, 2013 and incorporated herein by reference.

What is claimed is:

1. An oxide composition, represented by:

$ZnO_{1-x}S_{x+\alpha}$ ($0 < x \leq 0.5$, $0 < \alpha \leq 0.03$)

where part of O sites of ZnO is substituted with an S atom, and another S atom is provided to an interstitial site by doping, and wherein the oxide composition is p-type and a band gap of the p-type oxide composition is 2.5 eV to 3.3 eV.

2. The oxide composition according to claim 1, wherein the oxide composition is in the form of a film.

3. The oxide composition according to claim 1, wherein x satisfies the relationship represented by $0 < x \leq 0.3$.

4. The oxide composition according to claim 1, wherein an electrical resistivity of the oxide composition is greater than 0 Ωcm but $5 \times 10^5$ Ωcm or less.

* * * * *